(12) United States Patent
Scobee et al.

(10) Patent No.: US 12,181,940 B2
(45) Date of Patent: *Dec. 31, 2024

(54) TEMPERATURE CONTROL COMPONENT FOR ELECTRONIC SYSTEMS WHEREIN A THERMAL TRANSFER COMPONENT IS TAPPERED

(71) Applicant: Micron Technology, Inc., Boise, ID (US)

(72) Inventors: Daniel G. Scobee, Ione, CA (US); Aleksandr Semenuk, Orangevale, CA (US); Aswin Thiruvengadam, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 151 days.

This patent is subject to a terminal disclaimer.

(21) Appl. No.: 17/724,622

(22) Filed: Apr. 20, 2022

(65) Prior Publication Data

US 2022/0244765 A1 Aug. 4, 2022

Related U.S. Application Data

(63) Continuation of application No. 16/711,109, filed on Dec. 11, 2019, now Pat. No. 11,334,129.

(51) Int. Cl.
G06F 1/20 (2006.01)

(52) U.S. Cl.
CPC .................................. G06F 1/206 (2013.01)

(58) Field of Classification Search
CPC ...................................................... G06F 1/206
See application file for complete search history.

(56) References Cited

U.S. PATENT DOCUMENTS

| 4,011,104 A | 3/1977 | Basiulis |
| 4,782,291 A | 11/1988 | Blandin |
| 4,796,155 A | 1/1989 | Saito et al. |
| 5,390,077 A | 2/1995 | Paterson |

(Continued)

FOREIGN PATENT DOCUMENTS

| CN | 2831423 Y | 10/2006 |
| CN | 106415434 A | 2/2017 |

(Continued)

OTHER PUBLICATIONS

Extended European Search Report for European Application No. 20899683.5, mailed Oct. 5, 2023, 12 pages.

(Continued)

*Primary Examiner* — Suresh Suryawanshi
(74) *Attorney, Agent, or Firm* — LOWENSTEIN SANDLER LLP

(57) ABSTRACT

An apparatus includes a first thermoelectric component (TEC), a second TEC, a thermal transfer component disposed between the first TEC and the second TEC and a thermal conduction layer. The thermal conduction layer is coupled to the second TEC. The thermal conduction layer includes a planar area configured to be positioned above two or more electronic devices of multiple electronic devices of an electronic system to transfer thermal energy at the two or more electronic devices based on the first TEC, the second TEC and the thermal transfer component.

20 Claims, 10 Drawing Sheets

(56) References Cited

U.S. PATENT DOCUMENTS

| | | | |
|---|---|---|---|
| 5,936,192 A | 8/1999 | Tauchi | |
| 6,064,572 A | 5/2000 | Remsburg | |
| 6,820,684 B1 | 11/2004 | Chu | |
| 11,121,125 B2 | 9/2021 | Scobee | |
| 2001/0052234 A1 | 12/2001 | Venkatasubramanian | |
| 2002/0124573 A1 | 4/2002 | Evans | |
| 2004/0069339 A1* | 4/2004 | Dai | H10N 10/13 136/203 |
| 2004/0118129 A1* | 6/2004 | Chrysler | F25B 21/02 62/3.2 |
| 2005/0045702 A1 | 3/2005 | Freeman et al. | |
| 2006/0113690 A1 | 6/2006 | Huddart | |
| 2007/0112401 A1* | 5/2007 | Balachandran | A61F 7/02 607/104 |
| 2008/0178920 A1 | 7/2008 | Ullo | |
| 2008/0184710 A1 | 8/2008 | DeVilbiss | |
| 2009/0009204 A1 | 1/2009 | Lee | |
| 2009/0139244 A1* | 6/2009 | Ullo | H10N 10/857 29/890.03 |
| 2010/0053868 A1 | 3/2010 | Yang et al. | |
| 2011/0023930 A1* | 2/2011 | Konig | H10N 10/817 438/54 |
| 2011/0062312 A1 | 3/2011 | Hosking et al. | |
| 2011/0247670 A1 | 10/2011 | Ohmura et al. | |
| 2012/0118038 A1 | 5/2012 | Brocker | |
| 2012/0132242 A1 | 5/2012 | Chu et al. | |
| 2012/0192574 A1 | 8/2012 | Ghoshal et al. | |
| 2013/0003765 A1 | 1/2013 | Connolly et al. | |
| 2013/0027068 A1 | 1/2013 | Li et al. | |
| 2013/0133338 A1 | 5/2013 | Ludwig | |
| 2013/0133339 A1 | 5/2013 | Kim | |
| 2013/0139524 A1 | 6/2013 | Kim | |
| 2013/0284227 A1 | 10/2013 | Scheben et al. | |
| 2013/0285686 A1 | 10/2013 | Malik et al. | |
| 2014/0103947 A1 | 4/2014 | Phan et al. | |
| 2014/0240913 A1 | 8/2014 | Vyshetsky | |
| 2015/0372448 A1* | 12/2015 | Connolly | H01S 1/02 372/20 |
| 2016/0094258 A1 | 3/2016 | Bae et al. | |
| 2017/0023281 A1 | 1/2017 | Fromm et al. | |
| 2019/0074237 A1 | 3/2019 | Beauchemin et al. | |
| 2020/0194650 A1* | 6/2020 | Scobee | G01N 25/18 |

FOREIGN PATENT DOCUMENTS

| | | |
|---|---|---|
| CN | 107807296 A | 3/2018 |
| CN | 108702853 A | 10/2018 |
| CN | 110161400 A | 8/2019 |
| DE | 102005008361 A1 | 9/2006 |
| EP | 1959262 A1 | 8/2008 |
| JP | 2005127753 A | 5/2005 |
| KR | 20000059576 A | 10/2000 |
| KR | 20090024413 A | 3/2009 |
| KR | 20110139226 A | 12/2011 |
| KR | 20120121676 A | 11/2012 |
| KR | 20130061487 A | 6/2013 |
| KR | 20150106444 A | 9/2015 |
| WO | 0063968 A1 | 10/2000 |
| WO | 2015001523 A1 | 1/2015 |
| WO | 2017210108 A1 | 12/2017 |
| WO | 2020123519 | 6/2020 |

OTHER PUBLICATIONS

International Search Report and Written Opinion mailed on Apr. 1, 2020, on application No. PCT/US2019/065495.
International Search Report and Written Opinion mailed on Apr. 9, 2020, on application No. PCT/US2019/065764.
International Search Report and Written Opinion mailed on Jun. 17, 2021, on application No. PCT/US2021/119359.
International Search Report and Written Opinion mailed on Jun. 17, 2021, on application No. PCT/US2020/064377.
Extended European Search Report for Application No. 19895124.6, mailed on Dec. 8, 2022, 11 pages.
Extended European Search Report for European Application No. 19896653.3, mailed Jul. 26, 2022, 8 Pages.
International Search Report and Written Opinion for International Application No. PCT/US2020/064362, mailed Apr. 5, 2021, 6 Pages.
Office Action for Chinese Patent Application No. 201980089281.3, mailed Jul. 23, 2024, 19 Pages.

* cited by examiner

TEMPERATURE CONTROL COMPONENT FOR ELECTRONIC SYSTEMS WHEREIN A THERMAL TRANSFER COMPONENT IS TAPPERED

RELATED APPLICATION

This application is a continuation application of U.S. patent application Ser. No. 16/711,109, filed Dec. 11, 2019, the entire contents of which are hereby incorporated by reference herein.

TECHNICAL FIELD

The present disclosure generally relates to a temperature control component, and more specifically, relates to a temperature control component for electronic systems.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure. The drawings, however, should not be taken to limit the disclosure to the specific embodiments, but are for explanation and understanding only.

DETAILED DESCRIPTION

Figure 1:
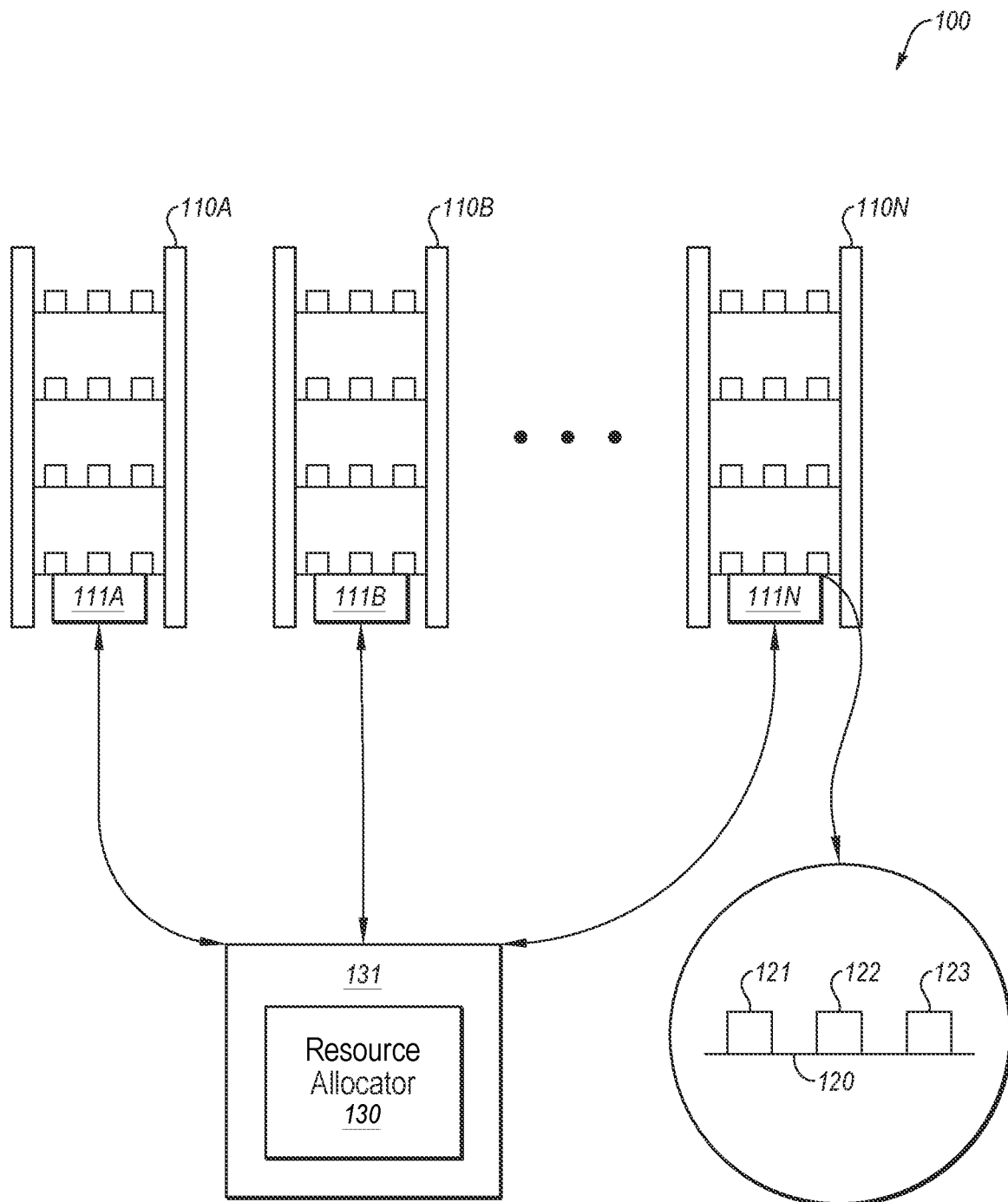
FIG. 1 illustrates an example environment to allocate test resources to perform a test of electronic devices, such as memory components, in accordance with some embodiments of the disclosure.

Aspects of the present disclosure are directed to a temperature control component for use with electronic systems. In a conventional thermal test process, electronic devices can be placed into a chamber (i.e., an oven) that tests the electronic devices under various temperature conditions. For example, a single chamber can be used to test components of multiple memory subsystems at a single time at a particular temperature. Hot or cold gas can be pumped into the chamber to control the temperature of the chamber and the temperature of the electronic devices therein. The test process can instruct various operations to be performed at the electronic devices at the particular temperature. Such operations can include, but are not limited to, read operations, write operations, or erase operations. The performance and behavior of the electronic devices can be observed or measured while the test process is performed. For example, performance characteristics (e.g., read or write latencies) and reliability of data stored at the memory components can be measured and recorded during the test process. However, since the chamber can only apply a single temperature to all the electronic devices at any particular time, the testing of the electronic devices at many different temperatures can require a large amount of time as the test process will need to be performed for each desired temperature. Moreover, all the components of a system within the chamber are controlled to the same temperature, and in some instances it is desired to test only a subset of the components of a system at a certain temperature. Additionally, the chamber can only perform a single test process at a time. As such, performing different tests on the electronic devices at different operating conditions (e.g., different temperatures) can utilize a large amount of time if many different conditions of the test process for the electronic devices are desired.

A thermoelectric component (TEC) (also referred to as a "thermoelectric cooler") can transduce electrical energy into thermal energy, and vice versa. A TEC can include two surfaces. When a voltage potential is applied to the TEC one surface heats while the other surface concurrently cools. In some conventional systems, a thermoelectric component can be directly applied to an object, such as one or more electronic devices of an electronic system, to change the temperature of the object. However, in some instances the TEC is shaped in a manner that is not conducive to transferring thermal energy to the one or more electronic devices. Additionally, in some instances applying a single TEC to an electrical device does not transfer enough thermal energy to meet the temperature testing range of some thermal testing conditions. Moreover, an electronic system can include multiple electronic devices that are coupled to a circuit board. The multiple electronic devices can have different vertical heights. Using one or more planar TECs to contact all or a desired subset of the electronic devices may not be feasible.

In some conventional systems, to address the removal of excess heat, two TECs with varying sizes can be stacked directly upon one another. In addition to the above stated challenges, stacking two TECs on top of one another can be highly inefficient and is often not sufficient in transferring enough thermal energy to meet the temperature testing ranges for electrical devices.

Aspects of the disclosure address the above and other challenges by providing a temperature control component that implements one or more TECs that are coupled to a thermal conduction layer. The thermal conduction layer includes a bottom surface that includes a planar area. The planar area of the thermal conduction layer can be positioned above one or more electronic devices of an electronic system to transfer thermal energy to the one or more electronic devices.

In some embodiments, the bottom surface of the thermal conduction layer includes one or more notched areas. The planar area is intersected by the notched area. The notched area includes a void or air gap such that the notched area does not thermally couple to the electronic devices directly under the notched area. The planar area and the notched area of the bottom surface of the thermal conduction layer can allow the temperature control component to transfer thermal energy to some of the electronic devices of the electronic system and insulate other electronic devices of the electronic system from the transfer of thermal energy.

In some embodiments, the planar area of the thermal conduction layer can be coupled to a thermal pad. In some embodiments, the thermal pad is compressible and thermally conductive. The thermal pad can allow the temperature control component, and specifically the planar area of the thermal conduction layer to thermally couple to electronic devices that have varying vertical heights.

In some embodiments, the temperature control component includes an upper TEC that includes a top surface and a bottom surface. The temperature control component also includes a thermal transfer component that includes a top surface and a bottom surface. The bottom surface of the upper TEC is coupled to the top surface of the thermal transfer component. The temperature control component includes a lower TEC. The top surface of the lower TEC is coupled to the bottom surface of the thermal transfer component. The temperature control component includes a thermal conduction layer with a top surface and a bottom surface. The top surface of the thermal conduction layer is coupled to the bottom surface of the lower TEC. The bottom surface of the thermal conduction layer includes a planar area that is to be positioned above two or more electronic devices of an electronic system to transfer thermal energy at the electronic devices.

Advantages of the present disclosure include, but are not limited to, providing a temperature control component that allows for efficient thermal energy transfer between the temperature control component and one or more electronic devices of an electronic system. Moreover, multiple temperature control components can be implemented to independently control thermal conditions at respective electronic systems, which allows for more efficient electronic device testing under different thermal conditions. Additionally, aspects of the present disclosure can apply thermal conditions in a temperature range that is broader and lower than conventional testing systems. Many different tests of the electrical devices can be performed more quickly and the reliability of the electrical devices can also be improved as any potential defects or flaws can be identified and later addressed in the design or manufacturing of the electrical devices.

FIG. 1 illustrates an example environment to allocate test resources to perform a test of electronic devices, such as memory components, in accordance with some embodiments of the disclosure. A test platform 100 can include one or more racks 110A, 110B, and 110N. Each of the racks 110A, 110B, and 110N can include multiple frames 120 where each frame 120 includes one or more thermal chambers. The test platform 100 can include any number of racks or thermal chambers.

In some embodiments, a thermal chamber can enclose an electronic system within the chamber of the thermal chamber. The electronic system can have one or more electronic devices. In some embodiments, multiple electronic devices are coupled to a circuit board to form the electronic system. In some embodiments, the electronic device can be a discrete component that is encased in a package (e.g., ceramic packaging material). The package material can have pins, solder bumps, or terminals external to the package that connect on-chip or on-die elements to off-chip or off-die elements (e.g., a power supply, other components at the circuit board, etc.).

As shown, a frame 120 can include one or more thermal chambers. For example, a frame 120 can include a first thermal chamber 121, a second thermal chamber 122, and a third thermal chamber 123. Although three thermal chambers are shown, a frame 120 can include any number of thermal chambers. Additionally, each thermal chamber can be fitted with a temperature control component that is used to apply a temperature condition to one or more of the electronic devices of the electronic system. For example, the temperature control component can thermally couple with the packages of electronic devices of a memory sub-system to adjust the package temperatures or on-die temperatures to a desired temperature value in a temperature range. In some embodiments, the temperature control component can be used to apply a temperature local to a respective electronic devices of a particular electronic system that is different than a temperature that is applied by another temperature control component to other respective electronic devices of another electronic system at the same or different frame 120. For example, a first temperature control component can apply a temperature of −20 degrees Celsius to the electronic devices of the a particular memory sub-system, and another temperature control component located adjacent to the first temperature control component can apply a temperature of 100 degrees Celsius to other electronic devices of another memory sub-system that is located at the same frame 120.

In some embodiments, the temperature control component can include one or more thermoelectric components (TEC). In some embodiment, the temperature control component that includes one or more TECs can utilize a Peltier effect to apply a heating or cooling effect to electronic devices of an electronic system that is coupled to the temperature control component. For example, a bottom part of the temperature control component can couple to the packages of the electronic devices of the electronics system to transfer thermal energy to and from the electronic devices. In some embodiments, the thermoelectric component can be a Peltier device. In some embodiments, the thermoelectric component can include an array of alternating n-type and p-type semiconductors disposed between two plates, such as two ceramic plates. A voltage applied to the thermoelectric component causes one plate to cool while another plate heats.

As shown, each test rack 110A, 110B, and 110N can include multiple frames 120. Each of the frames 120 of a particular test rack can be coupled with a local test component. For example, each test rack 110A, 110B, and 110N can respectively include a local test component 111A, 111B, and 111N. Each of the local test components 111A, 111B, and 111N can receive instructions to perform a test or a portion of a test that is to be performed at the thermal chambers of the respective test rack. For example, a resource allocator component 130 can receive (e.g., from a user) conditions of the test that is to be performed and the resource allocator component 130 can determine particular thermal chambers across the different frames 120 at one or more of the test racks 110A, 110B, and 110N that can be used by the test. In some embodiments, the resource allocator component 130 can be provided by a server 131. In some embodiments, the server 131 is a computing device or system that is coupled with the local test components 111A, 111B, and 111N over a network.

The temperate control component of each thermal chamber 121, 122, and 123 of each frame 120 can be used to apply a different temperature condition to electronic devices of the respective electronic system. Furthermore, a communication channel can be formed between each electronic system at each thermal chamber and server 131. For example, server 131 can control each electronic system such that each electronic system performs different operations under different thermal conditions.

The resource allocator component 130 can receive a test input from a user. The test input can specify conditions of the test that is to be performed with one or more electronic systems. For example, the test can specify particular temperature conditions that are to be applied to memory components of a memory sub-system and a sequence of operations that are to be performed at memory components under particular temperature conditions. The resource allocator 130 can retrieve a data structure that identifies available thermal chambers across the test platform 100 as well as characteristics of the available thermal chambers and the electronic systems therein. Subsequently, the resource allocator component 130 can assign thermal chambers at the test platform 100 that include electronic devices (e.g., embedded memory components) that match or satisfy the conditions of the test. The resource allocator component 130 can then transmit instructions to local test components of test racks that include thermal chambers that are to be used in the test.

In some embodiments, a thermal chamber can include one or more ports. The one or more ports can expose a chamber within the thermal chamber. The electronic devices of the electronic system are accessible from the one or more ports. In some embodiments, the one or more ports are configured to receive a temperature control component. In some embodiments, the bottom part of the temperature control component extends within the chamber of the thermal chamber and couples to respective electronic devices. The top part of the temperature control component, such a heat sink, can extend above the thermal chamber. In some embodiments, the temperature control component can be coupled to the thermal chamber. In some embodiments, the thermal chamber can be used to hold the temperature control component in place. In some embodiments, the thermal chamber can align the temperature control component with the respective electronic devices so that the bottom part of the temperature control component can couple with the respective electronic devices. The multiple temperature control components can concurrently apply different temperatures to the electronic systems within a thermal chamber. A thermal chamber is further described below at least with respect to FIGS. 3A-3B and FIGS. 4A-4B.

Figure 2A:
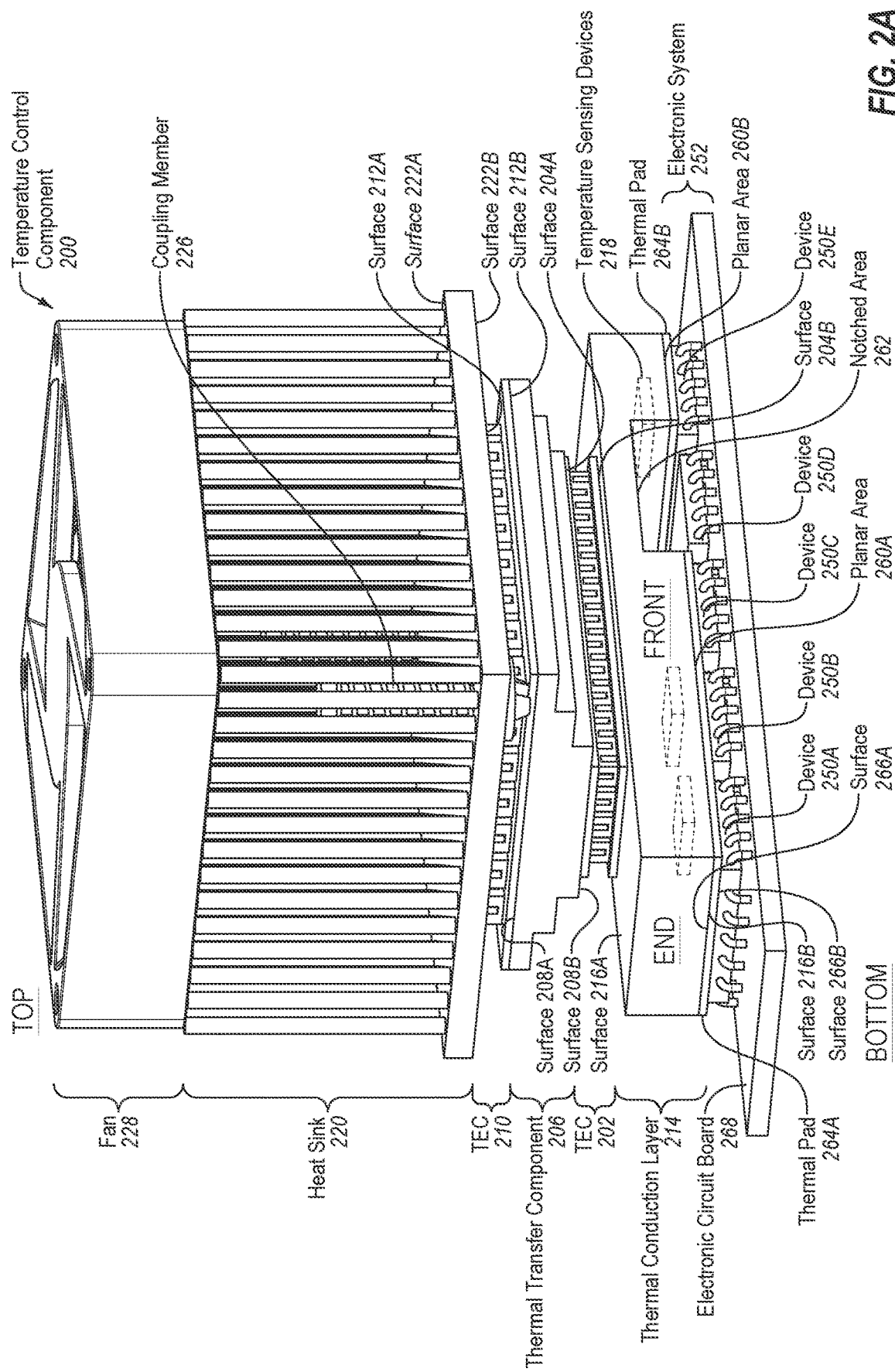
FIG. 2A illustrates a temperature control component in a collapsed view, in accordance with some embodiments of the disclosure.
Figure 2B:
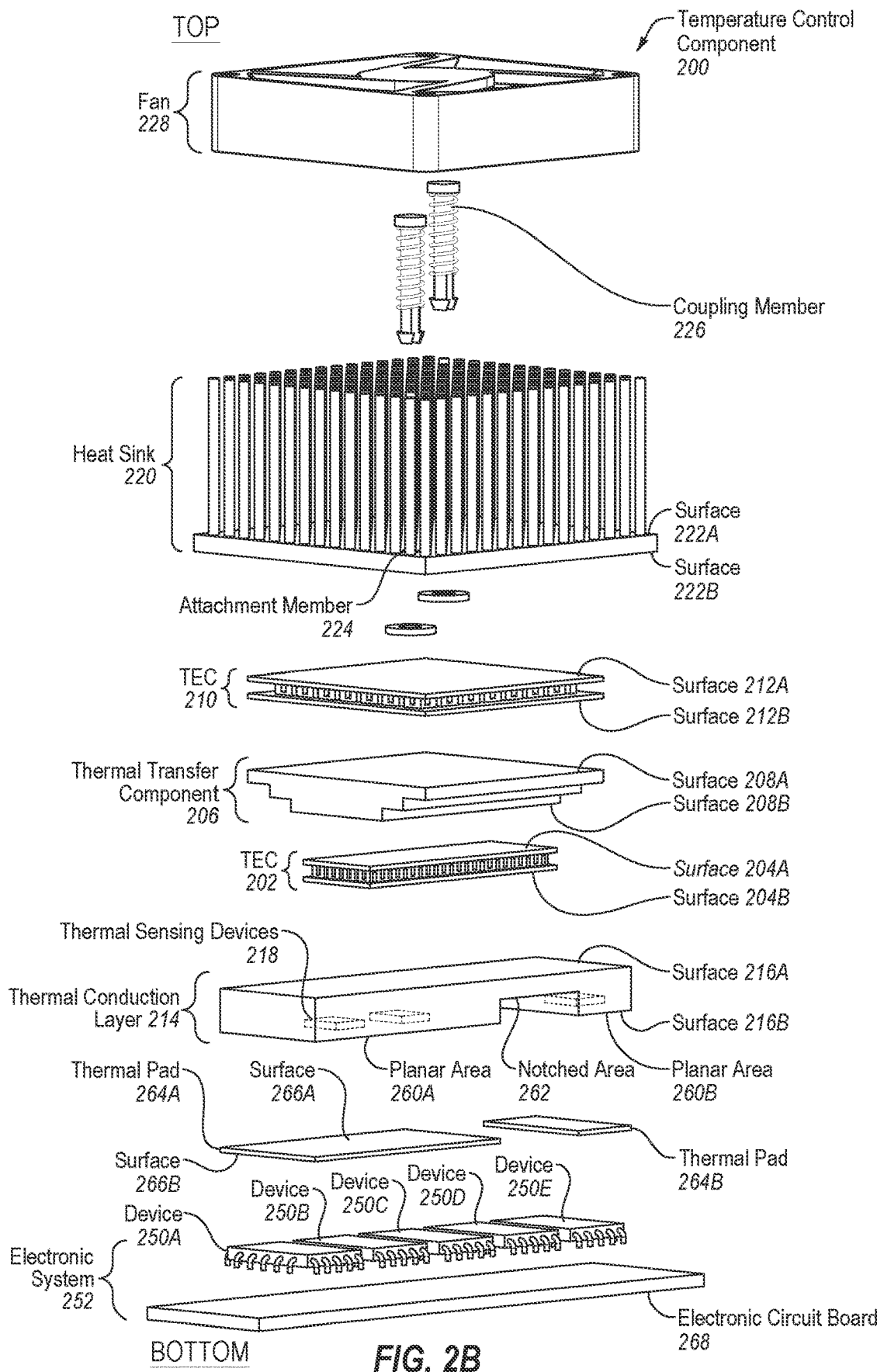
FIG. 2B illustrates a temperature control component in an expanded view, in accordance with some embodiments of the disclosure.
Figure 2C:
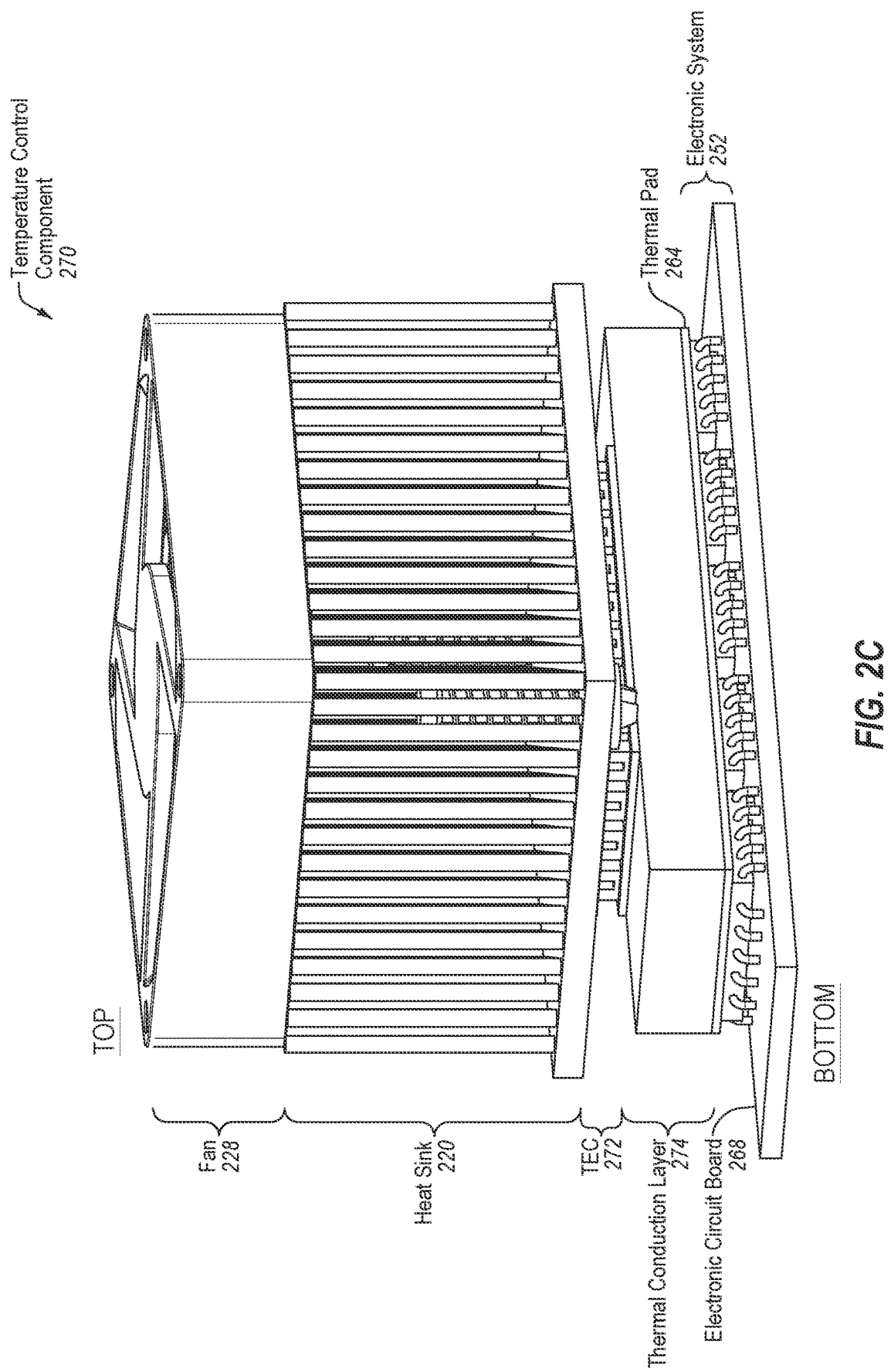
FIG. 2C illustrates an alternative temperature control component in a collapsed view, in accordance with some embodiments of the disclosure.
Figure 2D:
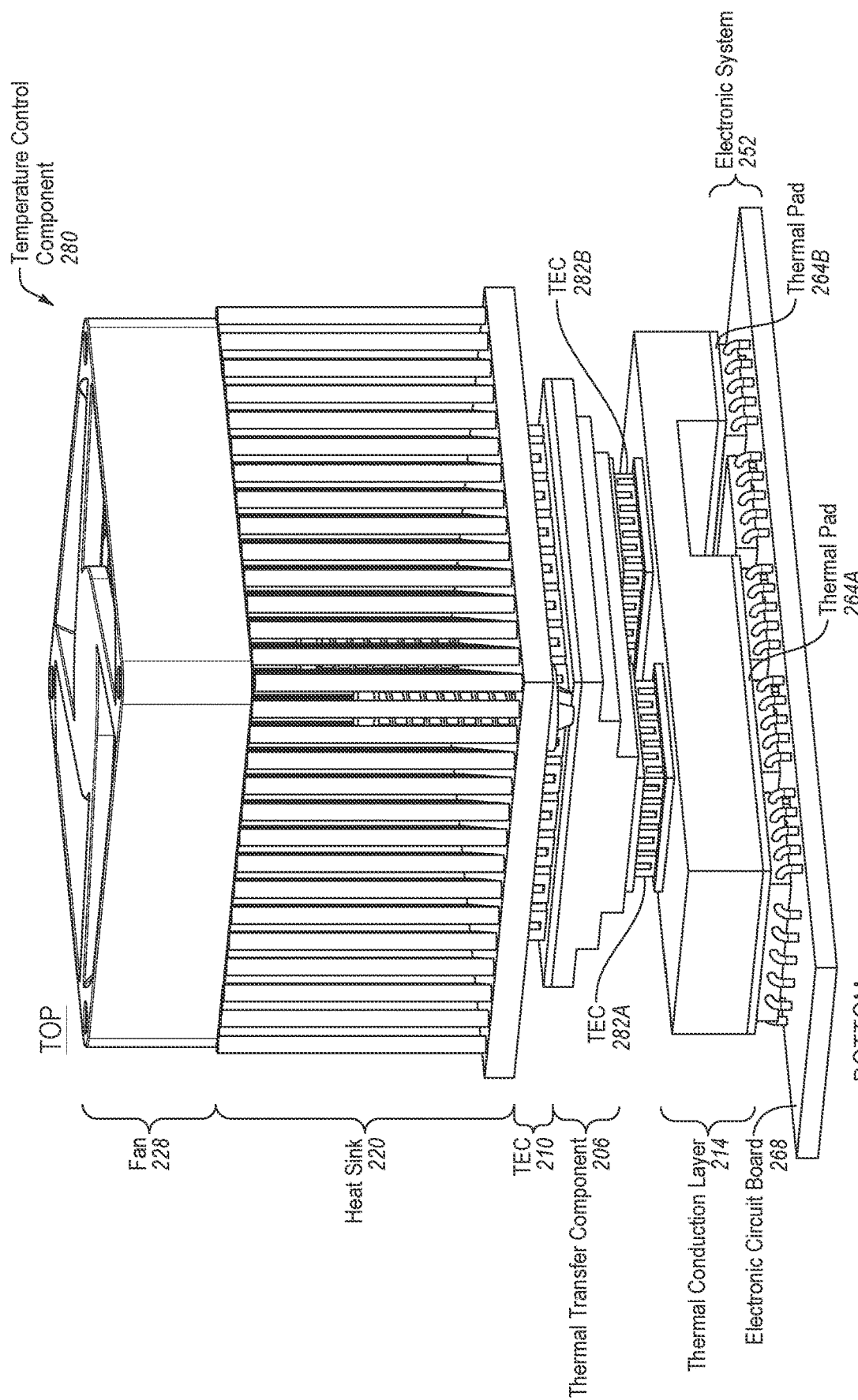
FIG. 2D illustrates another alternative temperature control component in a collapsed view, in accordance with some embodiments of the disclosure.

FIGS. 2A-2D illustrate a temperature control component, in accordance with some embodiments of the disclosure. FIG. 2A illustrates a temperature control component in a collapsed view, in accordance with some embodiments of the disclosure. FIG. 2B illustrates a temperature control component in an expanded view, in accordance with some embodiments of the disclosure. FIG. 2C illustrates an alternative temperature control component in a collapsed view, in accordance with some embodiments of the disclosure. FIG. 2D illustrates another alternative temperature control component in a collapsed view, in accordance with some embodiments of the disclosure. Temperature control component 200 is illustrated with a number of elements for purposes of illustration, rather than limitation. In other embodiments, temperature control component 200 can include the same, different, fewer, or additional elements. Temperature control component 200 is illustrated with relative positional relationships, such as top, bottom, front, and end, for purposes of illustration rather than limitation. It can be noted that assigning other positional relationships to temperature control component 200 and the elements of the temperature control component 200 is within the scope of the disclosure.

A thermoelectric component (TEC) (also referred to as a "thermoelectric cooler") can transduce electrical energy into thermal energy, and vice versa. A TEC can include two surfaces. When a voltage potential is applied to the TEC one surface heats while the other opposing surface concurrently cools. A TEC can generate more thermal energy at one surface than the TEC dissipates at an opposing surface. For example, for every 1 degree Celsius reduction at a first surface of a TEC, the opposing surface of the TEC generates approximately 3 degrees Celsius. Since the TEC generates a disproportionate amount of heat for each degree of cooling, removing the excess heat from one surface while cooling an electronic device with an opposing surface can be challenging. The challenges are particularly acute when testing electronic devices at extremely low temperatures, as the amount of heat generated is a multiple of the heat removed. In some embodiments, using a single TEC is not sufficient in transferring enough thermal energy to meet the temperature testing ranges for electronic devices. In other embodiments, using a single TEC can be sufficient for achieving the desired thermal testing conditions. In some embodiments, one or more TECs can be implemented and the number and location of the TECs can be determined based on design considerations and desired thermal testing conditions, for example.

In some embodiments, temperature control component 200 includes thermoelectric component (TEC) 202. In embodiments, the TEC, such as TEC 202, can serve as a heat pump to deliver heat to or remove heat from a surface. TEC 202 includes two surfaces 204, top surface 204A and bottom surface 204B. A TEC, such as TEC 202, is configured to concurrently increase the temperature of the top surface (e.g., top surface 204A) and decrease temperature of the bottom surface (e.g., bottom surface 204B), or concurrently decrease the temperature of the top surface (e.g., top surface 204A) and increase the temperature of the bottom surface (e.g., bottom surface 204B) based on a voltage potential applied to the TEC. In some embodiments, the TEC, such as TEC 202 and TEC 210, includes a set of electrical wires to couple a voltage potential to the TEC and deliver the requisite current to the TEC. The amount of heat removed or delivered to a surface can be controlled by the surface area of the TEC and/or the power supplied to the TEC. For example, if TEC 210 has two times the heat transfer capability of the TEC 202, TEC 210 can have a surface area that is two times the surface area of TEC 202 so that the heat transfer capability of TEC 210 is at least two times that of TEC 202. Alternatively, TEC 210 can have a surface area that is similar to TEC 202 but be supplied with twice the power and have twice the heat transfer capability.

In embodiments, temperature control component 200 includes TEC 210. TEC 210 can include two surfaces 212, such as top surface 212A and bottom surface 212B. In embodiments, the bottom surface 212B is coupled to the top surface 208A of thermal transfer component 206.

In some embodiments, the surface area of TEC 210 and TEC 202 can have any ratio (e.g., 1:1, 2:1, 1:2, etc.). In some embodiments, TEC 210 has a larger surface area than TEC 202. In some embodiments, TEC 210 is sized to efficiently transfer heat away from TEC 202 under the desired thermal conditions.

In some embodiments, one or more of TEC 210 or TEC 202 can include one or more TECs. For example, TEC 202 can include two more TECs that are distributed above thermal conduction layer 214 and coupled to thermal transfer component 206. In some embodiments, a single level of TECs can be implemented. For example, in some embodiments TEC 210 and thermal transfer component 206 are not implemented and TEC 202 can couple to surface 222B of heat sink 220. TEC 202 can include any number of TECs at that particular level.

For purposes of illustration rather than limitation, TEC 202 and TEC 210 are illustrated as particular shapes. In some embodiments, one or more of TEC 210 or TEC 202 can be any shape or size such a round TEC, rectangular TEC, square TEC, and so forth. In some embodiments, the shape of one or more of the selected TECs can be based on the surface shape of the electronic devices 250 or the shape of the electronic system 252. Electronic devices 250A-250E are generally referred to as "electronic devices 250" herein. For example, if the electronic system 252 is shaped as a rectangle with multiple electronic devices aligned in a row, a rectangular-shaped TEC (at least for TEC 202) that is shaped to couple to the electronic devices 250 of the electronic system 252 can help to efficiently transfer thermal energy to and from electronic devices 250. It can be noted that using TECs with different shapes is within the scope of the disclosure.

In some embodiments, temperature control component 200 includes thermal transfer component 206. In some embodiments, the thermal transfer component 206 efficiently conducts thermal energy from a surface of one TEC to an opposing surface of another TEC. For example, to cool electronic devices 250 under test, bottom surface 204B of TEC 202 removes thermal energy (e.g., heat) from the top surfaces of electronic devices 250. The top surface 204A of TEC 202 concurrently generates thermal energy, which is transferred via thermal transfer component 206 to the bottom surface 212B of TEC 210. TEC 210 can remove the received thermal energy at the bottom surface 212B of the TEC 210. The top surface 212A of TEC 219 can generated thermal energy, which is transferred to the heat sink 220 and dissipated in the surrounding environment.

In some embodiments, the thermal transfer component 206 is composed or made of a thermally conductive material. Thermally conductive materials include, but are not limited to, copper, aluminum, copper brass, or alloys of the aforementioned materials. It can be noted that other thermally conductive materials can be used. It can also be noted that materials having a higher thermal conductivity (k) can more efficiently transfer thermal energy between TEC 202 and TEC 210.

In some embodiments, thermal transfer component 206 includes at least two surfaces 208, including a top surface 208A and a bottom surface 208B. The bottom surface 208B of thermal transfer component 206 is coupled to the top surface 204A of TEC 202. The top surface 208A of thermal transfer component 206 is coupled to the bottom surface 212B of TEC 210.

In some embodiments, the thermal transfer component 206 can be coupled to a surface of an adjacent element using a thermal interface material, such as thermally conductive adhesives, thermal greases, phase change materials, thermal tapes, thermal pads, thermal epoxies, and so forth. For example, a thermal interface material can be disposed between the top surface 204A of TEC 202 and the bottom surface 208B of thermal transfer component 206, and between the top surface 208A of thermal transfer component 206 and the bottom surface 212B of TEC 210. In some embodiments, the thermal interface material can have at least a minimum conductivity of 150 Watts per meter-Kelvin (W/mk) or greater.

In some embodiments, the top surface 208A and bottom surface 208B of thermal transfer component 206 can have any number of shapes or sizes. In some embodiments, the thermal transfer component 206 is tapered such that the top surface 208A and bottom surface 208B align with the surface of the adjacent TECs, TEC 210 and TEC 202 respectively. In some embodiments, top surface 208A and bottom surface 208B of thermal transfer component 206 are sized to match or be close in size to the surface of the respective TECs. In some embodiments, the top surface 208A of the thermal transfer component 206 can be any shape. In some embodiments, the top surface 208A of the thermal transfer component 206 can be larger and/or smaller than the surface 212B of TEC 210. For example, the top surface 208A of the thermal transfer component 206 can be larger than the bottom surface 212 of TEC 210 such that none of the edges of TEC 210 extend over any of the edges of the top surface 208A of the thermal transfer component 206. In another example, the top surface 208A of thermal transfer component 206 can be larger than the bottom surface 212B of TEC 210 along one axis, but smaller than the bottom surface 212B of TEC 210 along another axis. For instance, TEC 210 can be longer but narrower than the top surface 208A of thermal transfer component 206. In some embodiments, the bottom surface 208B of the thermal transfer component 206 can by any shape. In some embodiments, the bottom surface 208B of the thermal transfer component 206 can be larger and/or smaller than the surface 204A of TEC 202.

In some embodiments, the thermal transfer component 206 can be step shaped as illustrated. In other embodiments, thermal transfer component 206 can have different shapes, such as a flat-sided pyramid that is tapered from a top surface to a bottom surface. In some embodiments, the shape of the thermal transfer component 206 can be based in part on the shape of the TEC that contacts a surface of the thermal transfer component 206. For example, in implementations that use round TECs the shape of the thermal transfer component 206 can be conical or cylindrical where the bottom surface and the top surface of the thermal transfer component 206 are round. In some embodiments, the thickness of the thermal transfer component 206 (between surface 208A and surface 208B) is greater than or equal to the thickness of one of TEC 202 or TEC 210.

In some embodiments, the temperature control component 200 can include a thermal conduction layer 214. The thermal conduction layer 214 layer can include a top surface 216A and a bottom surface 216B. In embodiments, the top surface 216A of the thermal conduction layer 214 is coupled to the bottom surface 204B of TEC 202. In some embodiments, the thermal conduction layer 214 can transfer thermal energy from the bottom surface 204B of TEC 202 to the bottom surface 216B of thermal conduction layer 214.

In some embodiments, the bottom surface 216B of thermal conduction layer 214 includes planar area 260A and planar area 260B (generally referred to as "planar area 260" herein). Planar area 260 can be positioned above one or more electronic devices 250 (e.g., electronic device 250A, 250B, 250C, and 250E) of electronic system 252 to transfer thermal energy to the underlying electronic devices 250. For example, the bottom surface 216B of thermal conduction layer 214 can be positioned to couple with the top surfaces of the packages of the electronic devices 250 of the electronic system 252 so that the package temperatures of the electronic devices 250 or the on-chip temperatures of the electronic are controlled to a desired temperature.

In some embodiments, the bottom surface 216B of thermal conduction layer 214 can include one or more notched areas, such as notched area 262. In some embodiments, the notched area 262 can be provided such that the one or more electronic devices (e.g., electronic device 250D) of the electronic system 252 directly below the notched area 262 are not coupled to the thermal conduction layer 214. The notched area 262 can allow an air gap between the underlying electronic device(s) and the thermal conduction layer 214 so that thermal energy is not transferred between the thermal conduction layer 214 and the electronic device(s) underlying the notched area 262.

In some embodiments, planar area 260 is intersected by the notched area 262. The notched area 262 can include a void in the thermal conduction layer 214 that extends in a vertical direction from the planar area 260 toward the top surface 216A of the thermal conduction layer 214. In some embodiments, the notched area 262 does not vertically intersect the thermal conduction layer 214 from the bottom surface 216B through the top surface 216A of the thermal conduction layer 214 (e.g., split the thermal conduction layer 214 into two pieces). The notched area 262 can leave some of the thermal conduction layer 214 above the notched area such that the thermal conduction layer 214 is a contiguous mass that efficiently conducts thermal energy.

In some embodiments, the thermal conduction layer 214 includes four sides, such as a front side, back side, first end, and second end. The notched area 262 can extend front side to the back side of the thermal conduction layer 214, as illustrated. In some embodiments, the planar area 260 of the bottom surface 216B of the thermal conduction layer 214 is intersected by the notched area 262 to form planar area 260A and planar area 260B. Planar area 260A and planar area 260B can be orientated parallel to a plane and orientated a same vertical distance from the plane. In some embodiments, the notched area 262 of the thermal conduction layer 214 is positioned above at least one electronic device 250 of the electronic system 252 to insulate the respective electronic device(s) 250 (e.g., electronic device 150D) from the transfer of thermal energy.

In some embodiments, the notched area 262 can be located at any position along the bottom surface 216B of the thermal conduction layer 214. For example, the notched area 262 can be at an end of the thermal conduction layer 214. In some embodiments, the notched area 262 can be any size, have any dimensions, and be located at any position with respect to the thermal conduction layer 214. In some embodiments, one or more of the size, dimensions, and location of the notched area 262 can be determined based on the location and size of the underlying electronic device(s) where the transfer of thermal energy is not desired.

In embodiments, the thermal conduction layer 214 can be coupled to TEC 202 using a thermal interface material, as described above. In embodiments, the thermal conduction layer 214 is composed of or made from a thermally conductive material, as described above.

In embodiments, the top surface 216A of thermal conduction layer 214 can be approximately that same size and the same shape as the bottom surface 204B of TEC 202. In some embodiments, the size and shape of surfaces 216 of thermal conduction layer 214 can be based on the size and shape of the top surface (e.g., contact surface) of the electronic devices 250. For example, the thermal conduction layer 214 can be shaped so that the bottom surface 216B couples to most if not all (in some cases, more than) the top surfaces of electronic devices 250. In some embodiments, the top surface 216A of the thermal conduction layer 214 is approximately the same size or larger than the bottom surface 204B of TEC 202. In some embodiments, the bottom surface 216B of the thermal conduction layer 214 can be the same size and shape as the top surface 216A of the thermal conduction layer 214. For example, the thermal conduction layer 214 can be a square cube or a rectangular cube. In some embodiments, the thermal conduction layer 214 can be tapered in one direction or another, e.g., from top surface 216A to bottom surface 216B or vice versa. It can be noted that that shape of thermal conduction layer 214 can be based at least in part on the shape of TEC 202, the electronic devices 250, or the electronic system 252.

In some embodiments, thermal conduction layer 214 can be an optional element and TEC 202 can couple with electronic devices 250 to transfer thermal energy to and from electronic devices 250.

In some embodiments, the temperature control component 200 can include one or more thermal sensing devices 218. In some embodiments, the thermal sensing devices 218 can be disposed or embedded within the thermal conduction layer 214. The thermal sensing devices 218 can be located within thermal conduction layer 214 so that the temperature sensing surfaces of the thermal sensing devices 218 are in close proximity to the bottom surface 216B of thermal conduction layer 214. In some embodiments, one or more thermal sensing devices 218 can be distributed across the thermal conduction layer 214. Thermal sensing devices 218 can be used to measure the temperature applied to the packages of electronic devices 250, which can effectively represent the temperature at the packages of the electronic devices 250 due to the low thermal resistance (k) of thermal conduction layer 214. In embodiments, the thermal sensing devices 218 can include any temperature sensing devices such as a thermocouple, capacitive temperature sensing device, resistive temperature sensing device, and so forth. In embodiments, the thermal sensing devices 218 can include a set of electrical wires to couple each thermal sensing device 218 to a measurement unit to measure the output of the thermal sensing device 218.

In some embodiments, the bottom surface 216B of the thermal conduction layer 214 can include a thermal interface material that is disposed between the thermal conduction layer 214 and the underlying electronic devices 250 of the electronic system 252. In some embodiments, the thermal interface material can be one or more of (e.g., characteristics), flexible, thermally conductive, compressible, electrically insulating, re-usable, and can return to an original shape after compression. An example of interface material having one or more of the aforementioned characteristics can be a thermal pad. In some embodiments, the vertical heights of the electronic devices 250 of the electronic system 252 can vary. To couple to the electronic devices 250 having varying heights, a thermal pad can be disposed between the thermal conduction layer 214 and electronic devices 250 to compensate for the varying heights and allow thermal energy to be efficiently transferred between the thermal conduction layer 214 and the electronic devices 250. The thermal pad can compress between thermal conduction layer 215 and the packages of the electronic devices 250 so that physical contact is made between the thermal pad and the underlying electronic devices 250, which enable thermal coupling between the thermal conduction layer 215 and the electronic devices 250 having varying heights.

In some embodiments, the thermal pad 264 can be applied to at least the planar area 260 of the thermal conduction layer 214. For example, thermal pad 264 includes thermal pad 264A and thermal pad 264B that correspond to the planar area 260A and planar area 260B, respectively. In some embodiments, the thermal pad 264 can include a top surface 266A and a bottom surface 266B. The top surface 266A of the thermal pad 264 can couple (e.g., adhere) to at least the planar area 260 of the bottom surface 216B of the thermal conduction layer 214.

In some embodiments, the electronic system 252 can have one or more electronic devices, as illustrated by electronic devices 250. The electronic system 252 is illustrated as a solid-state drive in an M.2 form factor. In other embodiments, electronic system 252 can be any type of electronic system or can be any size. In some embodiments, the electronic devices are mounted to an electronic circuit board. In some embodiments, one or more of the electronic devices 250 and the electronic circuit board are included in the electronic system 252. In some embodiments, the one or more of electronic devices 250 can include one or more temperature sensing devices, such as an on-chip temperature sensing device. The on-chip temperature can be different than the package temperature of the electronic device 250 due to thermal resistance of the package. Temperature measurements from the on-chip temperature sensing device, the thermal sensing devices 218 of the thermal conduction layer 214, or both can be used to perform thermal testing on the electronic devices 250.

In some embodiments, temperature control component 200 can include a heat sink 220. The heat sink 220 can include a top surface 222A and a bottom surface 222B. In embodiments, the top surface 222A can include a greater surface area than the bottom surface 222B to help facilitate thermal energy transfer from the heat sink 220 to an adjacent medium. In embodiments, the bottom surface 222B of heat sink 220 is coupled to the top surface 212A of TEC 210 to transfer thermal energy from TEC 210 to the heat sink 220. In some embodiments, the heat sink 220 and TEC 210 are coupled using a thermal interface material, as described above. In embodiments, the heat sink 220 is composed of thermally conductive material, as described above.

In some embodiments, the heat sink 220 is a passive mechanical device. In embodiments, the top surface 222A of the heat sink 220 includes multiple channels and multiple fins disposed on opposing sides of the channels. In other embodiments, the heat sink 220 can be another type of heat sink, such a liquid cooled heat sink and so forth.

In some embodiments, heat sink 220 includes one or more attachment members 224. In embodiments, the attachment members can be used to secure the temperature control component 200 to a thermal chamber. In some embodiments, the attachment members 224 are configured to receive adjustable coupling members 226 that can adjustably couple the temperature control component 200 to a thermal chamber. In some embodiments, the adjustable coupling member can include a spring element that allows a vertical position of the temperature control component 200 that is mounted to the thermal chamber to be adjusted.

In some embodiments, temperature control component 200 can include a fan, such as electric fan 228. In embodiments, the electric fan 228 is disposed above the top surface 222A of heat sink 220 and used to transfer thermal energy from the heat sink 220 to an adjacent medium, such as the gas medium local the temperature control component 200. The electrical fan 228 can include a set of electric wires that coupled to a voltage potential.

A single thermal transfer component 206 is shown for purposes of illustration, rather than limitation. In other embodiments, multiple thermal transfer components 206 can be used. For example, an additional thermal transfer component can be stacked on the top surface 212A of TEC 210. The additional thermal transfer component can be larger than thermal transfer component 206. For example, the bottom surface of the additional thermal transfer component can be approximately the same size as the top surface 212A of TEC 210. The additional thermal transfer component can be tapered such that the top surface of the additional thermal transfer component is larger than the bottom surface. In embodiments, the top surface of the additional thermal transfer component can be coupled to a TEC that is larger than (e.g., greater surface area) TEC 210. Any number of additional thermal transfer components or TECs can be implemented in other embodiments.

In FIG. 2C, temperature control component 270 uses a single level of TECs, such as TEC 272. Thermal conduction layer 274 does not include any notches. Thermal control component 270 does not implement a second level of TECs or a thermal transfer component. In FIG. 2D, temperature control component 280 includes two TECs, such as TEC 282A and TEC 282B, at a single level. It can be noted that elements of temperature control component 200, 270, and 280 can be mixed, matched, removed, or added to form different temperature control components.

Figure 3A:
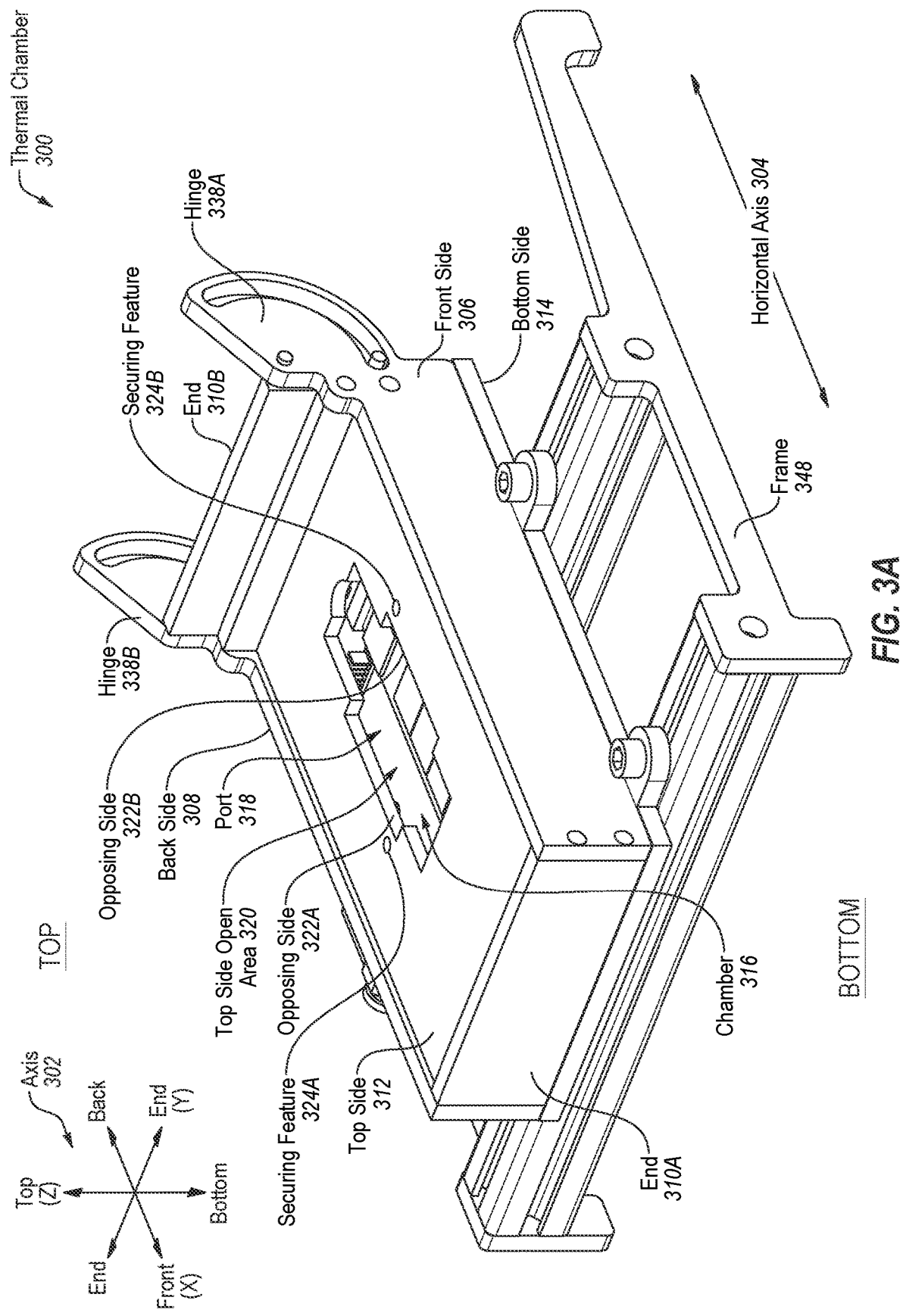
FIG. 3A illustrates a thermal chamber in a closed position, in accordance with embodiments of the disclosure.
Figure 3B:
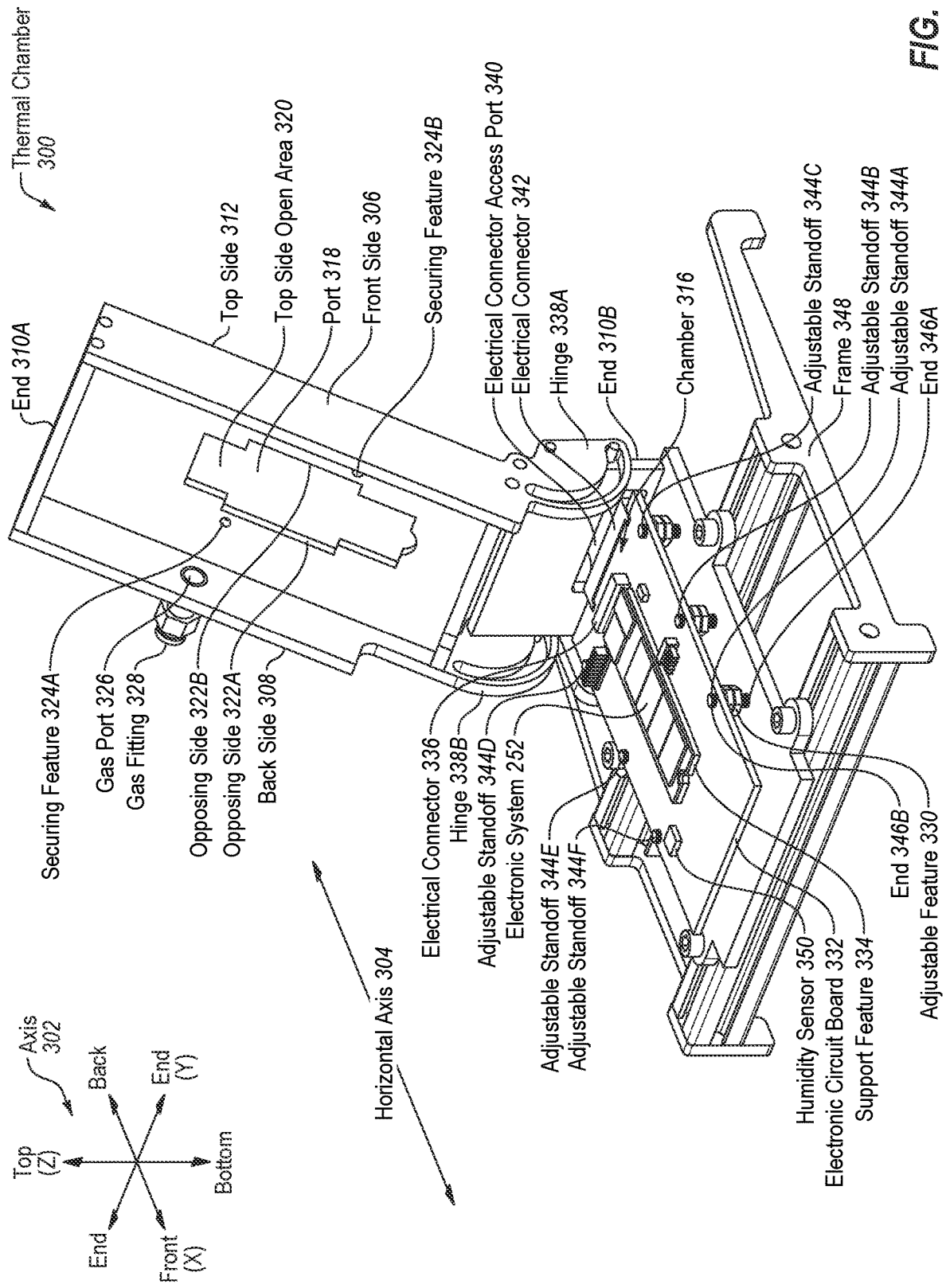
FIG. 3B illustrates a thermal chamber in an open position, in accordance with embodiments of the disclosure.

FIG. 3A-3B illustrates a thermal chamber, in accordance with embodiments of the disclosure. FIG. 3A illustrates a thermal chamber in a closed position, in accordance with embodiments of the disclosure. FIG. 3B illustrates a thermal chamber in an open position, in accordance with embodiments of the disclosure. Thermal chamber 300 is described with relative positional relationships, as shown by three-dimensional (3D) axis 302, for purposes of illustration rather than limitation. It can be noted that assigning other relative positional relationships to thermal chamber 300 is within the scope of the disclosure.

3D axis 302 includes the X-axis, the Y-axis, and the Z-axis. As illustrated, the X-axis points in the direction of the front and the back with respect to thermal chamber 300. The Y-axis points in the direction of the two ends with respect to thermal chamber 300. The Y-axis of 3D axis 302 corresponds to horizontal axis 304. The Z-axis points in the direction of the top and the bottom with respect to thermal chamber 300.

It can be noted that thermal chamber 300 can include one or more hinges, such as hinge 338A and 338B that allows the thermal chamber 300 to transition from an open position to a closed position, and vice versa. FIG. 3A illustrates thermal chamber 300 in a closed position. FIG. 3B illustrates thermal chamber 300 in an open position.

The following describes the positional relationships of the multiple sides of the thermal chamber 300 in the closed position. It can be appreciated that some of the positional relationships of one or more of the multiple sides can change by transitioning the thermal chamber 300 to another position, such as an open position, which is illustrated in FIG. 3B. In embodiments, thermal chamber 300 includes multiple sides, such a multiple rigid sides. The multiple sides include a back side 308 that is orientated parallel to horizontal axis 304, a front side 306 that is orientated parallel to the horizontal axis 304, end 310A that is orientated perpendicular to the horizontal axis 304 (e.g., along the X-axis), and end 310B that is orientated perpendicular to horizontal axis 304 and located opposite the end 310A.

The multiple sides of the thermal chamber 300 also include a top side 312 that is orientated perpendicular to the back side 308, front side 306, end 310A, and end 310B. The multiple sides of the thermal chamber 300 also include a bottom side 314 that is orientated perpendicular to the back side 308, front side 306, end 310A, and end 310B. In embodiments, in the closed position the multiple sides form a chamber 316 that is enclosed by the multiple sides.

In some embodiments, the thermal chamber 300 is coupled to a frame 348. For example, the bottom side 314 of the thermal chamber 300 can be secured to the frame 348 using one or more fasteners. In some embodiments, frame 348 can be used to with a rack, as illustrated in FIG. 1. Although a single thermal chamber 300 is illustrated as being secured to frame 348, in some embodiments one or more thermal chambers can be secured to a particular frame.

In some embodiments, the top side 312 includes one or more ports 318 orientated along a first direction of the horizontal axis 304. It can be further noted that thermal chamber 300 illustrates a single port 318 aligned along the horizontal axis 304, for purposes of illustration rather than limitation. In other embodiments, thermal chamber 300 can include any number of ports 318 located anywhere with respect to thermal chamber 300. In some embodiments, the port 318 include an open area (also referred to as "top side open area 320" herein) that exposes the chamber 316 within the thermal chamber 300. In embodiments, the port 318 is configured to receive a temperature control component, such as temperature control component 200 as described with respect to FIG. 2A-2D. The temperature control component 200 can be at a position with respect to the thermal chamber 300 so that the temperature control component 200 transfers thermal energy to and from the electronic devices that are exposed the via the chamber 316.

In some embodiments, one or more of the multiple sides are composed of a material that is one or more of a thermal insulator, non-conductive, or antistatic material. In some embodiments, that one or more of the multiple sides can be composed of a phenolic material. In some embodiments, the one or more of the multiple sides are composed of a conductive material. In some embodiments, the thermal chamber 300 composed of a conductive material can be grounded to a ground potential to help avoid electrostatic discharge damage at the electronic devices under test.

In some embodiments, port 318 includes at least a pair of opposing sides, such as opposing side 322A and opposing side 322B (generally referred to as "opposing sides 322" herein) of port 318. In some embodiments, port 318 can be associated with one or more securing features. Securing features allow the temperature control component 200 to be secured at the top side 312 of thermal chamber 300 and aligns the temperature control component 200 to contact the electronic devices that are exposed in the chamber 316 via the top side open area 312 of thermal chamber 300. For example, securing feature 324A is located adjacent to opposing side 322A of port 318. Securing feature 324B is located adjacent to opposing side 322B of port 318. Securing feature 324A and 324B (generally referred to as "securing features 324" herein) are associated with port 318 and allow for a respective temperature control component 200 to be secured at port 318. In some embodiments, securing features 324 include holes through the top side 312 of the thermal chamber 300. In embodiments, securing features 324 are each configured to receive an adjustable coupling member to adjustably couple the temperature control component 200 to the thermal chamber 300 at port 318. The number, shape, and locations of the securing features are provided for purposes of illustration, rather than limitation. In other embodiments, the number, shape, or location of the securing features can be different.

Turning to FIG. 3B, in embodiments, the thermal chamber 300 includes a gas port 326. The gas port 326 can be configured to allow gas into the chamber 316 of the thermal chamber 300 from an external gas source. The gas port 326 connects the outer surface of the thermal chamber 300 to the chamber of the thermal chamber 300. In some embodiments, the gas port 326 includes a hole, such as a circular hole, that is located at one of the multiple sides. For example, the gas port 326 can be located at the front side 306, back side 308, end 310A, end 310B, top side 312, or bottom side 314 of the thermal chamber 300. In an illustrative example, the gas port 326 is located at the back side 308 of the thermal chamber 300. In some embodiments, the gas port 326 is fitted with a gas fitting 328 that is coupled to the gas port 326. In some embodiments, a part of the gas fitting 328 can be fitted within the gas port 326 and another part of the gas fitting 328 can extend outside the thermal chamber 300. In some embodiments, the part of the gas fitting 328 that extends outside the thermal chamber 300 can be coupled to a gas hose that moves gas from a gas source into the chamber of the thermal chamber 300.

In some embodiments, the thermal chamber 300 includes one or more adjustable standoffs, such as adjustable standoff 344A, adjustable standoff 344B, adjustable standoff 344C, adjustable standoff 344D, adjustable standoff 344E, and adjustable standoff 344F (generally referred to as "adjustable standoff(s) 344" herein). In some embodiments the adjustable standoffs 344 can be coupled (e.g., mounted) to the bottom side 314 of the thermal chamber and be positioned perpendicular to the bottom side 314 of the thermal chamber 300. In some embodiments, each of the adjustable standoffs 344 include two ends. A first end is coupled to the bottom side 314 of the thermal chamber 300 and the second end is coupled to an electronic circuit board 332 that is located above the bottom side 314 of the thermal chamber 300. The adjustable standoffs 344 create a vertical distance (e.g., space) between the bottom side 314 of the thermal chamber 300 and the electronic circuit board 332. For example, adjustable feature 344A includes end 346A that is mounted to the bottom side 314 of the thermal chamber 300 and end 346B that extends above and perpendicular to the bottom side 314.

In some embodiments, one or more of the adjustable standoffs 344 can include an adjustable feature, such as adjustable feature 330. The vertical position of the adjustable feature 330 can be adjusted. For example, the adjustable feature 330 can include one or more nuts and the adjustable standoff 344A can include a threaded bolt. The adjustable feature 330 can be rotated in a counter-clockwise direction to move upwards or rotated in a clockwise direction to move downwards towards the bottom side 314 of the thermal chamber 300. On some embodiments, the electronic circuit board 332 can be mounted to the adjustable standoffs 344 and above the adjustable features of one or more adjustable standoffs 344. For example, the electronic circuit board 332 can rest on the adjustable features. The adjustable features can be raised or lowered so that the electronic circuit board 322 can be raised or lowered a similar distance.

In some embodiments, the electronic circuit board 332 can electrically interface with the electronic system 252. In some embodiments, the electronic circuit board 332 is not implemented and the electronic system 252 can be coupled within the thermal chamber 300 in a similar manner as described with respect to electronic circuit board 332.

In some embodiments, electronic circuit board 332 includes four sides, a top surface, and a bottom surface, all of which are contained within the chamber 316 of the thermal chamber 300 in the closed position. The bottom surface of the electronic circuit board 332 can face the bottom side 314 of the thermal chamber 300.

In some embodiments, an electrical connector 336 is coupled to the electronic circuit board 332. Electrical connector 336 is configured to couple the electronic system 252 with the electronic circuit board 332. In some embodiments, electrical connector 336 is above the electronic circuit board 332. When electronic system 252 is plugged into electrical connector 336, electronic system 252 is positioned above the electronic circuit board 332 such that there a vertical space between the top surface of the electronic circuit board 332 and the bottom surface of the electronic system 252.

In some embodiments, a support feature 334 can be located between a top surface of the electronic circuit board 332 and a bottom surface of electronic system 252. In some embodiments, the support feature includes a non-conductive material, such as rubber. In some embodiments, the support feature 334 supports the electronic system 252 above the electronic circuit board 332 at a fixed position. The support feature 334 is shown as a pad that is positioned beneath the electronic system 252 for purposed of illustration, rather than limitation. In other embodiments, the support feature can include one or more adjustable standoffs that are mounted to the electronic circuit board 332.

In some embodiments, an electrical connector 342 is coupled to the electronic circuit board 332. In some embodiments, electrical connector 342 is configured to couple the electronic system 252 to an external electronic system (e.g., server 131 of FIG. 1) that is external to the thermal chamber 300.

In some embodiments, at least one of the multiple sides of the thermal chamber 300 can include an electrical connector access port 340. For example, electrical connector access port 340 is illustrated at the end 310B of the thermal chamber 300. In some embodiments, electrical connector access port 340 is configured to allow a first end of an electrical cable to couple to electrical connector 342 and second end of the electrical cable to extend through the electrical connector access port 340 and outside the thermal chamber 300. For example, a ribbon cable can be coupled to electrical connector 342. The ribbon cable can extend outside the thermal chamber 300 and couple the electronic system 252 (and electronic circuit board 332) to a server, such as server 131 of FIG. 1. The server can send and receive signals to and from the electronic system 252 via the ribbon cable.

In some embodiments, one or more humidity sensors 350 can be located within the chamber 316 of the thermal chamber 300. The humidity sensor 350 can sense humidity level within the chamber 316. For purposes of illustration, rather than limitation, humidity sensor 350 is illustrated as coupled to electronic circuit board 332. In other embodiments, the humidity sensor 350 can be located anywhere within the thermal chamber 300.

In some embodiments, the thermal chamber 300 can include one or more hinges, such as hinge 338A and hinge 338B (generally referred to as "hinge(s) 338" herein). The one or more hinges can be coupled to any one or more sides of the multiple sides of the thermal chamber 300. For example, hinge 338A is coupled to end 310B and front side 306. Hinges 338 are configured to allow the thermal chamber 300 to transition between an open position and a closed position, and vice versa. The hinges 338 are configured to rotate the top side 312 of the thermal chamber 300 about an axis of rotation. The axis of rotation can be parallel to or perpendicular to the horizontal axis 304.

Figure 4A:
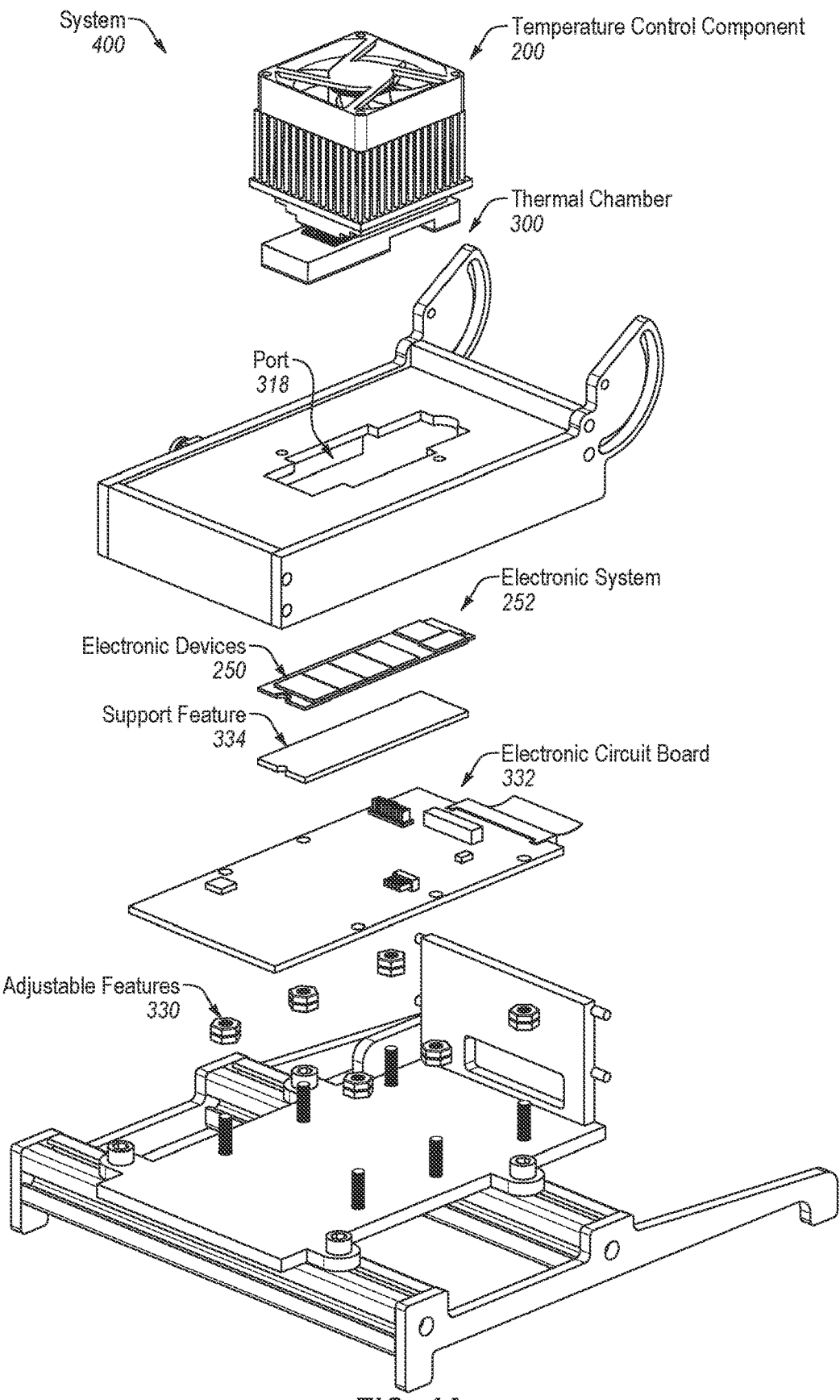
FIG. 4A illustrates a thermal testing system in an expanded view, in accordance with embodiments of the disclosure.
Figure 4B:
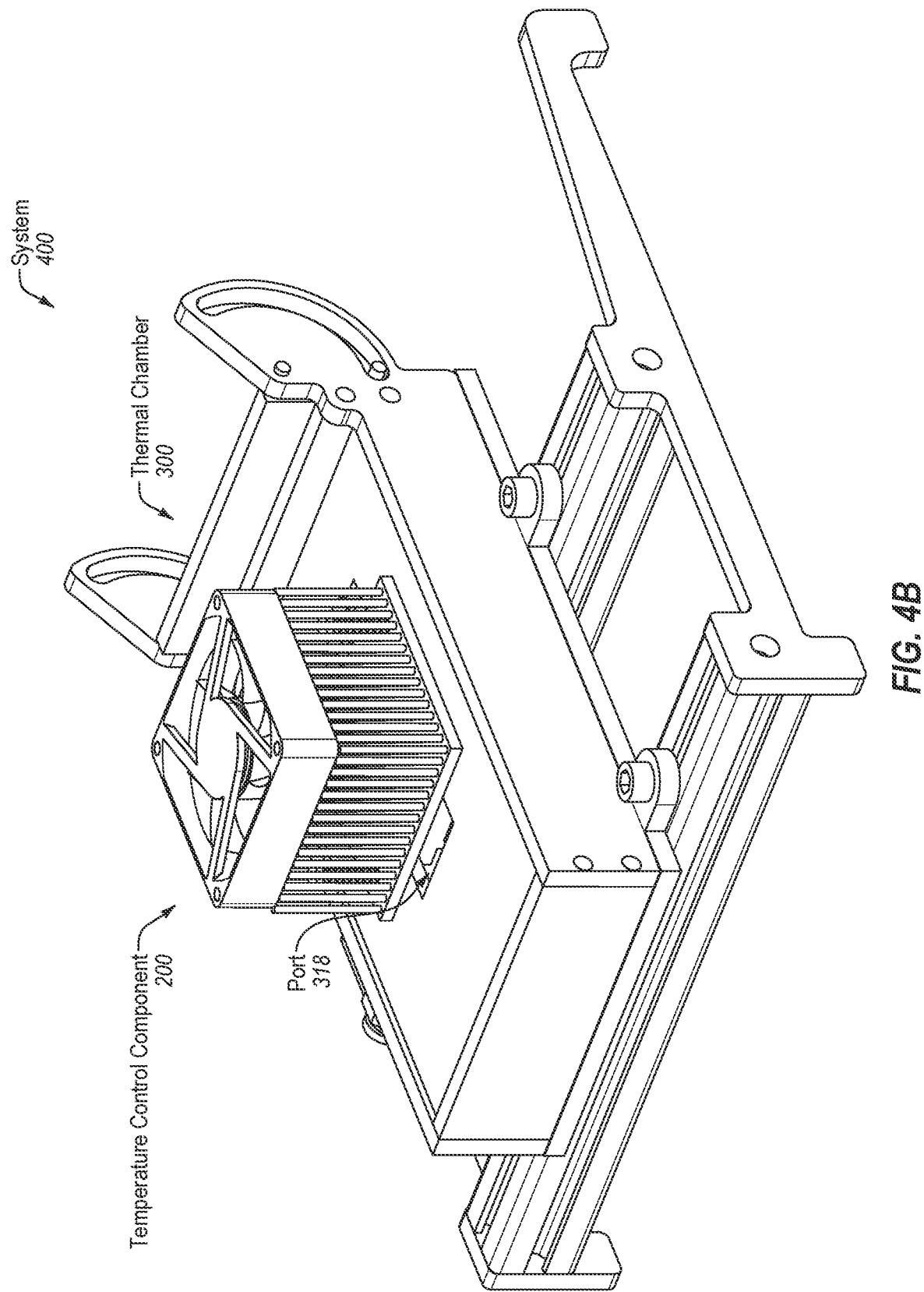
FIG. 4B illustrates a thermal testing system in a collapsed view, in accordance with embodiments of the disclosure.

FIGS. 4A-4B illustrate a system to test electronic devices of an electronic system under a variety of thermal conditions, in accordance with embodiments of the disclosure. FIG. 4A illustrates thermal testing system 400 in an expanded view, in accordance with embodiments of the disclosure. FIG. 4B illustrates thermal testing system 400 in a collapsed view, in accordance with embodiments of the disclosure. It can be noted that a temperature control component, such as temperature control component 200 of FIGS. 2A-2D, can be used with or be part of system 400. It can also be noted that a thermal chamber, such as thermal chamber 300 of FIG. 3A-3B, can be used with or be part of system 400. Elements of temperature control component 200 of FIGS. 2A-2D and thermal chamber 300 of FIG. 3A-3B are used to help illustrate aspects of FIGS. 4A-4B.

System 400 (e.g., also referred to as "thermal testing system 400" herein) can be used to test one or more electronic devices of one or more electronic systems under a variety of thermal conditions as described herein. In some embodiments, system 400 can include electronic circuit board 332. The electronic circuit board 332 can be coupled to one or more electronic systems 252 under test. In some embodiments, the electronic circuit board 332 can facilitate electrical signal transfer to and from the one or more electronic devices 250 and to and from any additional elements or systems coupled to the electronic circuit board 332. In embodiments, the electronic circuit board 332 can facilitate power transmission to and from the one or more electronic devices 250 and to and from any additional elements coupled to the electronic circuit board 332. For example, one or more humidity sensors can be coupled to the electronic circuit board 332 and the electronic circuit board 332 can supply power to the one or more humidity sensors. In some embodiments, the electronic circuit board 332 can be coupled to an external system, such as a server. The external system via the electronic circuit board 332 can be used to transmit instructions to perform read operations, write operations, or erase operations at the electronic devices 250 of the electronic system 252 during the performance of the thermal test. Furthermore, the external system can be used to retrieve information or test data from the electronic devices 250 during the performance of the thermal test.

In some embodiments, the thermal chamber 300 can include one or more ports 318. The one or more ports 318 can expose a chamber within the thermal chamber 300. The electronic system 252 is coupled to an electrical connector of the electronic circuit board 332. The electronic devices 250 of the electronic system 252 are accessible from the port 318.

In some embodiments, a temperature control component 200 is coupled at a top side of the thermal chamber 300. In some embodiments, port 318 of the thermal chamber 300 is configured to receive a temperature control component 200. In some embodiments, the bottom part of the temperature control component 200 extends within the chamber of the thermal chamber 300 and couples with at least some electronic devices 250 of the electronic system 252 to transfer thermal energy to and from the respective electronic devices 250. The top part of the temperature control component 200 extends above the top side of the thermal chamber 300.

For example, the top part of the temperature control component 200, such as a heat sink, can extend above the thermal chamber 300. The bottom part of the temperature control component 200, such as the thermal conduction layer 214 and the thermal pad extend within the thermal chamber. In some embodiments, the thermal pad physically contacts a top surface of the electronic devices 250. The temperature control component 200 can transfer thermal energy to and from the electronic devices 250. For example, temperature control component 200 can change the temperature of the electronic devices 250 (e.g., package temperature or on-die temperature) in a temperature range from −40 degrees Celsius to 140 degrees Celsius.

In some embodiments, the temperature control component 200 can be coupled to the thermal chamber 300. In some embodiments, the thermal chamber 300 can be used to hold the temperature control component 200 in place. In some embodiments, the thermal chamber 300 can align the temperature control component 200 with the electronic devices 250 of the electronic system 252 so that the bottom part of the temperature control component 200 can couple to the respective electronic devices 250. In embodiments where the thermal chamber 300 includes multiple ports that hold multiple temperature control components 200, the thermal chamber 300 using the adjustable coupling members can allow each of the temperature control components 200 to apply similar or equal or consistent pressure to each of the electronic devices of the respective electronic systems. The multiple temperature control components 200 can concurrently apply different temperatures to the electronic devices of different electronic systems within the thermal chamber 300.

In some embodiments, the temperature control component 200 can include attachment members, such as attachment member 224 of FIGS. 2A-2D. In embodiments, the thermal chamber 300 can include securing features, such as securing features 324 of FIG. 3A-3B. In some embodiments, the adjustable coupling members can be coupled to the attachment members of the temperature control component 200 and the securing features 324 of the thermal chamber 300 to adjustably couple the temperature control component 200 to the thermal chamber 300. In some embodiments, the attachment members and the securing features are configured to receive adjustable coupling members that can adjustably couple the temperature control component 200 to the thermal chamber 300. In some embodiments, the adjustable coupling member can include a spring element that allows a vertical position of the temperature control component 200 that is mounted to the thermal chamber 300 to be adjusted.

In some embodiments, a positive pressure environment within the chamber of thermal chamber 300 is created using gas that is injected within the chamber of the thermal chamber. In some embodiments, rather than hermetically sealing the thermal chamber 300, the thermal chamber 300 (e.g., chamber within the thermal chamber 300) can be maintained as a positive pressure environment so that the only gas going into the thermal chamber 300 is from the gas port, and the only gas escaping the thermal chamber 300 is gas from the gas port. In some embodiments the thermal chamber 300 can include a gas port to receive the gas, such as oil free air (OFA) or nitrogen gas or clean dry air or gas (CDA). In some embodiments, the gas can have a dew point lower than the expected cold temperatures range under test. In some embodiments, the gas can have less than 1 part-per-million (ppm) carbon dioxide and less than 0.003 ppm hydrocarbon vapor. The thermal chamber 300 can be used to control the environment proximate to the electronic devices 250 under test. In embodiments, the gas provided to the thermal chamber 300 has a dew point that is lower than the lowest temperature under which the electronic devices 250 are to be tested. Such a gas is provided to the thermal chamber 300 so that condensate, such as moisture or ice, does not form at the electronic devices 250 during test. For example, the package of the electronic device under test can be controlled within a temperature range from −25 degrees Celsius to 140 degrees Celsius. The dew point of the gas can be below −25 degrees Celsius (e.g., −90 degrees Celsius). When a temperature of −25 C is applied to the electronic devices under test by the temperature control component 200, condensate does not form at the electronic devices based on the low dew point of the gas provided within the cavity of thermal chamber 300.

In embodiments, rather than changing the temperature of the thermal chamber 300 using hot or cold gas, the temperature control component 200 can maintain the temperature environment local to the electronic devices 252 under test. In embodiments where the thermal chamber 300 includes multiple temperature control components 200 coupled to multiple electronic systems 252, each of the temperature control components 200 can be independently controlled and maintain a different (or same) temperature at the electronic devices of respective electronic systems under test without using hot or cold gas. For example, first electronic devices of a first electronic system under test can be coupled to a first temperature control component. Second electronic devices of a second electronic system under test can contact a second control component. Both the first and the second temperature control component can be coupled to a single thermal chamber. The first temperature control component can maintain a temperature at the first electronic devices at 100 degrees Celsius while the second temperature control component can maintain a temperature at the second electronic devices at 0 degrees Celsius.

Figure 5:
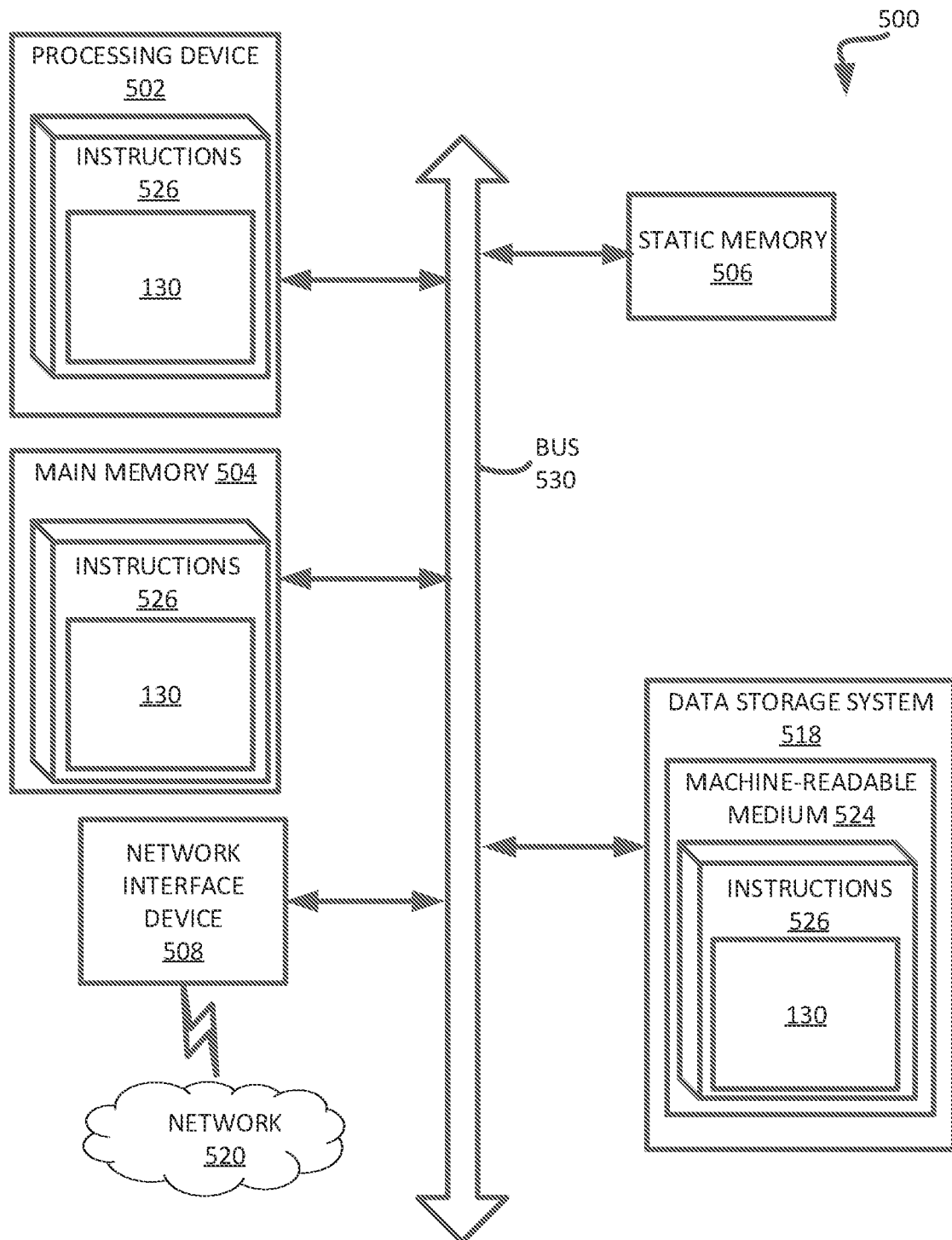
FIG. 5 is a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host or server system that includes, is coupled to, or utilizes a test platform (e.g., to execute operations corresponding to the resource allocator component 130 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to a memory sub-system.

In one embodiment, the instructions 526 include instructions to implement functionality corresponding to a resource allocator component (e.g., the resource allocator component 130 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
    a first thermoelectric component (TEC);
    a second TEC;
    a thermal transfer component disposed between the first TEC and the second TEC, wherein the thermal transfer component is tapered between a first surface that is thermally coupled to the first TEC and a second surface that is thermally coupled to the second TEC; and
    a thermal conduction layer coupled to the second TEC, wherein the thermal conduction layer comprises a planar area configured to be positioned above two or more electronic devices of a plurality of electronic devices of an electronic system to transfer thermal energy at the two or more electronic devices based on the first TEC, the second TEC and the thermal transfer component.

2. The apparatus of claim 1, wherein a bottom surface of the thermal conduction layer further comprises a notched area, wherein the planar area is intersected by the notched area, and wherein the notched area comprises a void in the thermal conduction layer that extends in a vertical direction from the planar area towards the second TEC.

3. The apparatus of claim 2, wherein the thermal conduction layer further comprises a top surface, a front side, a back side, a first end, and a second end, and wherein the notched area extends from the front side to the back side of the thermal conduction layer.

4. The apparatus of claim 2, wherein the planar area at the bottom surface of the thermal conduction layer is intersected by the notched area to form a first planar sub-area and a second planar sub-area, wherein the first planar sub-area and the second planar sub-area are orientated parallel to a plane and orientated a same vertical distance from the plane.

5. The apparatus of claim 2, wherein the notched area of the thermal conduction layer is to be positioned above at least one electronic device of the plurality of electronic devices to insulate the at least one electronic device from the transfer of the thermal energy.

6. The apparatus of claim 1, further comprising:
    a thermal pad comprising a top surface and a bottom surface, wherein the top surface of the thermal pad to couple to at least the planar area of the bottom surface of the thermal conduction layer.

7. The apparatus of claim 6, wherein the thermal pad comprises a material that is thermally conductive, an electrical insulator, and compressible.

8. The apparatus of claim 1, further comprising:
    a heat sink comprising a top surface and a bottom surface, wherein the bottom surface of the heat sink is coupled to the first TEC to transfer the thermal energy from the first TEC to the heat sink.

9. The apparatus of claim 8, further comprising:
    a plurality of attachment members of the heat sink, the plurality of attachment members to receive a plurality of adjustable coupling members to adjustably couple the apparatus to a thermal chamber.

10. The apparatus of claim 8, further comprising:
    an electric fan disposed above the top surface of the heat sink to transfer the thermal energy from the heat sink to an adjacent medium.

11. A system to test a plurality of electronic devices under a variety of thermal conditions, the system comprising:
    an electronic system comprising the plurality of electronic devices; and
    a temperature control component comprising:
        a first thermoelectric component (TEC);
        a second TEC;
        a thermal transfer component disposed between the first TEC and the second TEC, wherein the thermal transfer component is tapered between a first surface that is thermally coupled to the first TEC and a second surface that is thermally coupled to the second TEC; and
        a thermal conduction layer coupled to the second TEC, wherein the thermal conduction layer comprises a planar area configured to be positioned above two or more electronic devices of the plurality of electronic devices of the electronic system to transfer thermal energy at the two or more electronic devices based on the first TEC, the second TEC and the thermal transfer component.

12. The system of claim 11, further comprising:
    a thermal chamber comprising a plurality of sides, wherein a side of the plurality of sides comprises a port that exposes a chamber within the thermal chamber, wherein the port is configured to receive a bottom part of the temperature control component within the chamber, and wherein a top part of the temperature control component extends externally to the thermal chamber.

13. The system of claim 11, wherein a bottom surface of the thermal conduction layer further comprises a notched area, wherein the planar area is intersected by the notched area, and wherein the notched area comprises a void in the thermal conduction layer that extends in a vertical direction from the planar area towards the second TEC.

14. The system of claim 13, wherein the thermal conduction layer further comprises a top surface, a front side, a back side, a first end, and a second end, and wherein the notched area extends from the front side to the back side of the thermal conduction layer.

15. The system of claim 13, wherein the planar area at the bottom surface of the thermal conduction layer is intersected by the notched area to form a first planar sub-area and a second planar sub-area, wherein the first planar sub-area and the second planar sub-area are orientated parallel to a plane and orientated a same vertical distance from the plane.

16. The system of claim 13, wherein the notched area of the thermal conduction layer is to be positioned above at least one electronic device of the plurality of electronic devices to insulate the at least one electronic device from the transfer of the thermal energy.

17. The system of claim 13, further comprising:
    a thermal pad comprising a top surface and a bottom surface, wherein the top surface of the thermal pad to couple to at least the planar area of the bottom surface of the thermal conduction layer.

18. The system of claim 17, wherein the thermal pad comprises a material that is thermally conductive, an electrical insulator, and compressible.

19. The system of claim 18, further comprising:
a heat sink comprising a top surface and a bottom surface, wherein the bottom surface of the heat sink is coupled to the first TEC to transfer the thermal energy from the first TEC to the heat sink.

20. The system of claim 19, further comprising:
a plurality of attachment members of the heat sink, the plurality of attachment members to receive a plurality of adjustable coupling members to adjustably couple the thermal transfer component to a thermal chamber.

* * * * *